United States Patent [19]

Yamashita et al.

[11] 4,426,702

[45] Jan. 17, 1984

[54] SEMICONDUCTOR LASER DEVICE

[75] Inventors: Shigeo Yamashita; Hiroshi Matsuda, both of Hachioji; Uichiroo Kobayashi, Takasaki; Masayoshi Kobayashi, Hachioji; Hisao Nakashima, Tokorozawa, all of Japan

[73] Assignee: Hitachi, Ltd., Tokyo, Japan

[21] Appl. No.: 283,791

[22] Filed: Jul. 15, 1981

[30] Foreign Application Priority Data

Jul. 23, 1980 [JP] Japan ............................. 55-99918

[51] Int. Cl.$^3$ ............................................. H01S 3/19
[52] U.S. Cl. ........................................ 372/45; 357/17; 372/46
[58] Field of Search ................ 372/44, 45, 46; 357/17

[56] References Cited

PUBLICATIONS

Tsang et al., "GaAs-Al$_x$Ga$_{1-x}$As Buried-Heterostructure . . . ", Appl. Phys. Lett., 36(9), May 1, 1980, pp. 730-733.
Nakashima et al., "Transverse Mode Control . . . ", Japanese Journal of Applied Physics, vol. 19, No. 10, Oct. 1980, pp. L591-L594.
Chinone et al., "Highly Efficient (GaAl)As Buried-Heterostructure . . . ", Appl. Phys. Lett., 35(7), Oct. 1, 1979, pp. 513-516.
S. Arai et al., "Buried Heterostructure Lasers", Electronics Letters, May 8, 1980, vol. 16, No. 10, pp. 349-350.

Primary Examiner—James W. Davie
Attorney, Agent, or Firm—Kenyon & Kenyon

[57] ABSTRACT

This invention consists in improvements in a buried-heterostructure laser with buried optical guide, and facilitates the oscillation of the laser in the fundamental mode thereof and also enhances the available percentage of production of the laser. An active layer and an optical guide layer are sandwiched between two cladding layers, to form an optical confinement region. The width of the semiconductor material assembly varies in the direction of the stacked layers, and the narrowest part thereof is located on a side opposite to the optical guide layer with reference to the position of the active layer. The side surface of said semiconductor material assembly parallel to the traveling direction of laser radiation is buried by a burying layer.

10 Claims, 9 Drawing Figures

SEMICONDUCTOR LASER DEVICE

BACKGROUND OF THE INVENTION

1. Field of the Invention

This invention relates to buried-heterostructure lasers with buried optical guide which produce high outputs and which facilitate stable oscillations in fundamental modes.

2. Description of the Prior Art

As a semiconductor laser of high output, there is an example in which an optical guide layer is introduced in adjacency to an active layer in a double-heterostructure. It is, for instance, a semiconductor laser of a GaAs-GaAlAs heterostructure wherein one layer of GaAs is interposed between two layers of GaAlAs, the GaAs layer forms the PN-junction of the laser, at least one layer in the GaAlAs layers is an inner layer, and the inner layer is overlaid with an outer layer of GaAlAs having a greater mole fraction of AlAs than the inner layer. Examples of this type of semiconductor laser are disclosed in the official gazette of Japanese Laid-open Patent Application No. 47-8472; 'Appl. Phys. Lett.', 35(7), 1 October, 1979, pp. 513–516; etc. The semiconductor laser of this type has a structure in which photons and carriers are confined between different semiconductor layers.

SUMMARY OF THE INVENTION

In buried-heterostructure semiconductor lasers employing optical guide layers as have heretofore been known, it has been the problem that the available percentage of production for elements stably oscillating in their fundamental mode is inferior.

This invention intends to provide an element structure with which high-output semiconductor laser elements of the specified type can be produced at very high available percentage.

This invention consists in a structure in which the central part of an optical resonator of a semiconductor laser with optical guide is preponderantly excited, whereas both the end parts are not excited.

The fundamental structure is as follows.

At least first, second, third and fourth semiconductor layers are stacked on a predetermined semiconductor body. The second semiconductor layer is set to be low in the refractive index relatively to a third semiconductor layer, the first and fourth semiconductor layers are set to be low in the refractive index relatively to both the second and third semiconductor layers and also to have conductivity types opposite to each other, and the fourth and second semiconductor layers are set to be wide in the band gap relatively to the third semiconductor layer. A semiconductor material assembly including the first, second, third and fourth semiconductor layers has its side surfaces, parallel to the travelling direction of a laser beam, buried in a fifth semiconductor layer. The refractive index of the fifth semiconductor layer is at least lower than that of the third semiconductor layer, and the band gap of the fifth semiconductor layer is at least wider than that of the third semiconductor layer. In the mesa-shaped semiconductor material assembly constructed of the first to fourth semiconductor layers, the width of the mesa changes in the stacked direction of the layers, and the narrowest part of the mesa is located on the side opposite to the second semiconductor layer with reference to the position of the third semiconductor layer.

DETAILED DESCRIPTION OF THE PREFERRED EMBODIMENTS

Figure 1:
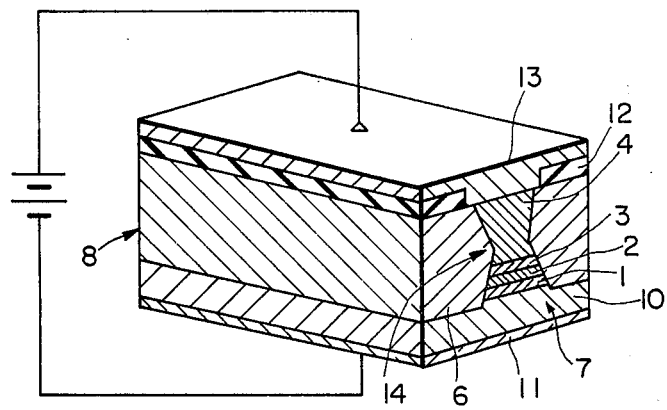
FIG. 1 is a perspective view of a semiconductor device according to this invention.

Hereunder, this invention will be described in detail with reference to the drawings, FIG. 1 is a perspective view of a typical semiconductor laser device according to this invention.

On a GaAs substrate 10 having the (100) face as its upper surface, there are formed an n-$Ga_{1-x}Al_xAs$ ($0.2 \leq x \leq 0.6$) layer 1, an n-$Ga_{1-z}Al_zAs$ ($0.1 \leq z \leq 0.5$) layer 2, a $Ga_{1-w}Al_wAs$ ($0 \leq w \leq 0.3$) layer 3 and a p-$Ga_{1-v}Al_vAs$ ($0.2 \leq v \leq 0.6$) layer 4. A semiconductor layer 6 is a burying layer which is a $Ga_{1-u}Al_uAs$ ($0.1 \leq u \leq 0.6$) layer. In order to prevent leakage current, the burying layer is preferably made a high-resistivity semiconductor layer having a resistivity of at least approximately $10^4$ $\Omega$.cm, or a construction which consists of a plurality of layers and in which a p-n junction is formed and is reverse-biased during the operation of the laser.

In this example, it is important that the position of the active layer 3 lies below the position 14 of the constriction of the mesa-shaped semiconductor layers. That is, the narrowest part of the mesa lies on the side opposite to the optical guide layer with reference to the position of the active layer. By adopting such structure, the width of the active layer 3 can be made smaller than that of the optical guide layer 2 in which the laser beam can exist. Accordingly, the laser beam is distributed in the central part of the active layer 3 as well as the optical guide layer 2. Since, however, a gain is attained in the active layer region, only a middle part is excited in the section of a waveguide portion. Simultaneously, the equivalent refractive index in the lateral direction varies gradually, with the result that higher-order modes becomes difficult of excitation. In this way, it becomes easy to attain stable oscillations in the fundamental mode. In contrast, in case where the position of the active layer lies above the position of the constriction of the mesa-shaped semiconductor layers contrariwise to the structure of this invention, the optical resonator is excited up to its end parts and the higher-order modes become easy of generation.

In FIG. 1, numerals 11 and 13 indicate electrodes. By way of example, the electrode 11 is made of Au+AuGeNi, and the electrode 13 is made of Cr+Au.

The active layer 3 and the cladding layers 1 and 4 may be constructed as in the prior-art double-heterostructure. In general, the thickness of the active layer 3 is selected in a range of 0.02 μm to 0.2 μm, and the thicknesses of the cladding layers 1 and 4 are selected in a range of 0.3 μm to 2.5 μm or so. The thicknesses of the cladding layers 1 and 4 do not affect characteristics so greatly as the thicknesses of the active layer and the optical guide layer to be described later. The respective refractive indices $n_3$ and $n_1$ of the active layer 3 and the first cladding layer 1 are set in practical use so that their difference may be 0.18-0.22 or so.

The first and second cladding layers 1 and 4 have conductivity types opposite to each other. The semiconductor body 10 is somtimes made up of a plurality of semiconductor layers. In some cases, a semiconductor layer is further disposed on the second cladding layer 4 as, for example, a cap layer. However, the basic structure is as stated above.

In adjacency to the active layer in the prior-art double-heterostructure, the optical guide layer is introduced which differs in the band gap from the active layer at least 0.15 eV. Owing to this expedient, it is possible to maintain the temperature characteristic of a threshold current density very stably and to increase an optical output. The refractive index profile of the stacked structure of the foregoing example is as shown in FIG. 2.

Figure 2:
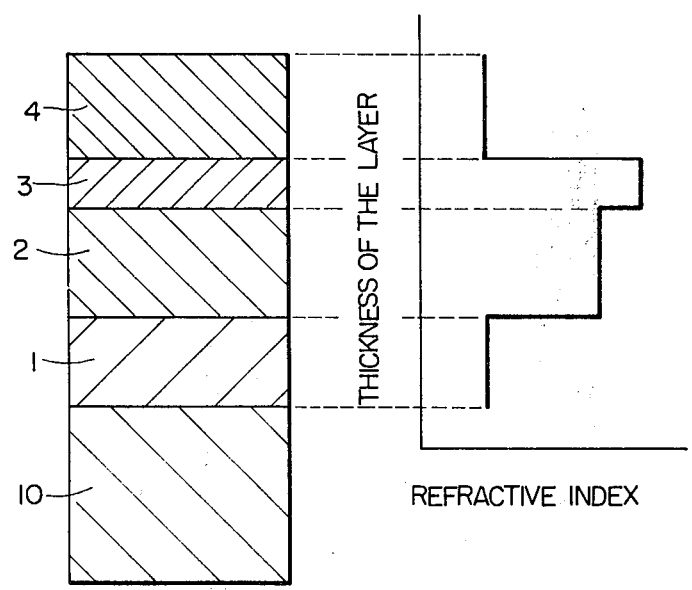
FIG. 2 is a diagram showing a structure for the optical confinement of the semiconductor laser device and a refractive index profile thereof.

As illustrated in FIG. 2, the refractive index $n_3$ of the active layer 3 and the refractive indices $n_1$ and $n_4$ of the respective cladding layers 1 and 4 are brought into the relationship of $n_3 > n_1$, $n_4$, which is the same as in the prior-art double-heterostructure. In contrast, the refractive index $n_2$ of the optical guide layer 2 is set at $n_3 > n_2 > n_1$, $n_4$. Owing to this relationship of the refractive indices, the laser beam becomes distributed in the active layer and the optical guide layer, and the increase of the optical output can be achieved. On the other hand, the respective band gaps $E_{g3}$, $E_{g1}$ and $E_{g2}$ of the active layer 3 and the adjoining cladding layer 1 and optical guide layer 2 are brought into the relationship of $E_{g3} < E_{g1}$, $E_{g2}$, whereby the confinement of carriers into the active layer is made sufficient. In this case, the difference between the band gaps of the optical guide layer 2 and the active layer 3 needs to be at least 0.15 eV. When the difference of the band gaps is smaller than this value, especially the temperature characteristic of the threshold current worsens unfavorably.

EXAMPLES

Description will be made with reference to FIG. 1.

On an n-type GaAs substrate 10 having the (100) face as its upper surface, an n-type $Ga_{1-x}Al_xAs$ ($0.2 \leq x \leq 0.6$) layer 1 (doped with Sn, a carrier concentration of $5 \times 10^{17}$ cm$^{-3}$), an n-type $Ga_{1-y}Al_yAs$ ($0.1 \leq y \leq 0.3$) layer 2 (doped with Sn, a carrier concentration of $5 \times 10^{17}$ cm$^{-3}$), a $Ga_{1-w}Al_wAs$ ($0 \leq w \leq 0.15$) layer 3 (undoped, a carrier concentration of $1 \times 10^{17}$ cm$^{-3}$) and a p-type $Ga_{1-v}Al_vAs$ ($0.2 \leq v \leq 0.4$) layer 4 (doped with Ge, a carrier concentration of $1 \times 10^{18}$ cm$^{-3}$) are continuously grown by the well-known liquid phase epitaxy. In order to meet the relationships of the refractive indices of the respective layers described before, $x > y$, $v > w$ and $v > y$ are selected.

The concrete constructions of semiconductor laser devices manufactured by way of trial are listed in Table 1. δ in the table indicates the distance between the narrowest part of the semiconductor material assembly and the position of the active layer.

TABLE 1

| | $Ga_{1-x}Al_xAs$ | | $Ga_{1-y}Al_yAs$ | | $Ga_{1-\omega}Al_\omega As$ | | $Ga_{1-v}Al_vAs$ | | $Ga_{1-u}Al_uAs$ | | δ |
|---|---|---|---|---|---|---|---|---|---|---|---|
| | x | Thickness | y | Thickness | ω | Thickness | v | Thickness | u | Thickness | (μm) |
| 1 | 0.32 | 1.0 μm | 0.28 | 0.6 μm | 0.05 | 0.05 μm | 0.38 | 2.8 μm | 0.36 | 4.4 μm | −0.3 |
| 2 | 0.32 | 1.0 | 0.24 | 0.6 | 0.05 | 0.10 | 0.38 | 2.8 | 0.32 | 4.4 | −0.3 |
| 3 | 0.32 | 1.0 | 0.22 | 0.6 | 0.05 | 0.15 | 0.38 | 2.8 | 0.30 | 4.4 | −0.3 |
| 4 | 0.32 | 1.0 | 0.26 | 1.0 | 0.05 | 0.05 | 0.38 | 2.8 | 0.34 | 4.8 | −0.3 |
| 5 | 0.32 | 1.0 | 0.23 | 1.0 | 0.05 | 0.10 | 0.38 | 2.8 | 0.31 | 4.8 | −0.2 |
| 6 | 0.32 | 1.0 | 0.21 | 1.0 | 0.05 | 0.15 | 0.38 | 2.8 | 0.29 | 4.8 | −0.2 |
| 7 | 0.32 | 1.0 | 0.23 | 1.5 | 0.05 | 0.05 | 0.38 | 2.8 | 0.31 | 5.3 | −0.4 |
| 8 | 0.32 | 1.0 | 0.22 | 1.5 | 0.05 | 0.08 | 0.38 | 2.8 | 0.30 | 5.3 | −0.4 |
| 9 | 0.32 | 1.0 | 0.21 | 1.5 | 0.05 | 0.10 | 0.38 | 2.8 | 0.29 | 5.3 | −0.4 |

Figure 3:
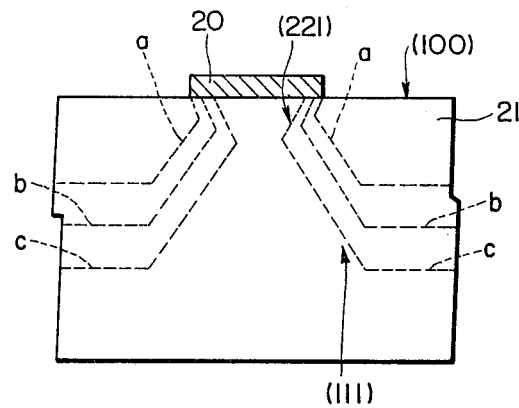
FIG. 3 is a diagram for explaining the etched states of a semiconductor crystal.

Subsequently, a striped mask having a stripe width of approximately 10 μm is formed on the surface of the semiconductor layer 4. In forming the mask, a PSG film is first deposited on the crystal surface to a thickness of approximately 4,000 Å, and parts other than the stripe are removed by the well-known etching process employing a photoresist. The direction of the striped mask is made the $<01\bar{1}<$ orientation. Using an etchant (for example, a mixed solution consisting of $H_3PO_4:1—H_2O_2:1—CH_3OH:3$), the stacked layers are etched until the surface of the semiconductor substrate 10 is exposed. Since the etchant exhibits a face orientation-dependency, the section of the crystal after the etching changes as indicated by dotted lines a, b and c in FIG. 3. Numeral 21 denotes the semiconductor crystal of the stacked layers, and numeral 20 the etching mask. As the crystal faces to demonstrate a wedge shape, the (221) and (111) faces often appear in case of the GaAs-GaAlAs system semiconductor crystal. Although the actual shape becomes somewhat obtuse, the basic construction is as stated above. An angle of about 71° is defined between the (100) face and the (221) face, and an angle of about 54° between the (100) face and the (111) face. By calculating the etching amount, accordingly, the position of the wedge of the mesa-shaped semiconductor layers can be determined. In case of, for example, the aforecited etchant, the etching condition is 8 minutes at 20° C. In semiconductor laser devices, the stripe width is usually set at a range of at most 3.2 μm. In practical use, the lower limit of the stripe width is approximately 0.5 μm for a reason in fabrication. At the next step, a $Ga_{1-u}Al_uAs$ layer 6 is grown on the mesa-shaped semiconductor layers other than the stripe portion by the well-known liquid phase epitaxy. Here, $u > w$ is set in order to confine the light distribution to the stripe portion. As the $Ga_{1-u}Al_uAs$ layer burying the parts other then the stripe portion, a p-type $Ga_{1-u}Al_uAs$ layer (doped with Ge, $p \sim 1 \times 10^{17}$ cm$^{-3}$) and an n-type $Ga_{1-u}Al_uAs$ layer (doped with Sn, $n \sim 5 \times 10^{13}$ cm$^{-3}$) are successively grown into a double-layer structure. This is intended to block current owing to the reverse bias of the p-n junction and to cause current to flow through the stripe portion efficiently. Of course, a construction including more layers is allowed.

Also in case of employing a $Ga_{1-u}Al_uAs$ layer of high resistivity ($\rho \geq 10^4$ $\Omega$cm) as the burying layer, a favorable result was obtained. The $Ga_{1-u}Al_uAs$ layer of high resistivity was formed in such a way that an undoped Ga-Al-As ternary solution was baked in $H_2$ at 800°–900° C. for about 5 hours and was thereafter started to grow. Also in this case, a structure adapted to effectively inject the current to the stripe portion could be formed.

After completion of the crystal growth, an $SiO_2$ film 12 is formed to a thickness of 3,000 Å by the CVD process. Using the conventional photolithography employing a photoresist, a region which corresponds to the upper part of the stacked structure of the semiconductor layers is selectively removed in the shape of a stripe 3 μm wide. Thereafter, Cr+Au is deposited by evaporation as a p-side electrode 13, and Au+AuGeNi as an n-side electrode 11. The end faces 7 and 8 of the semiconductor laser device opposing to each other are cleaved to form resonance reflection surfaces parallel to each other.

Figure 4:
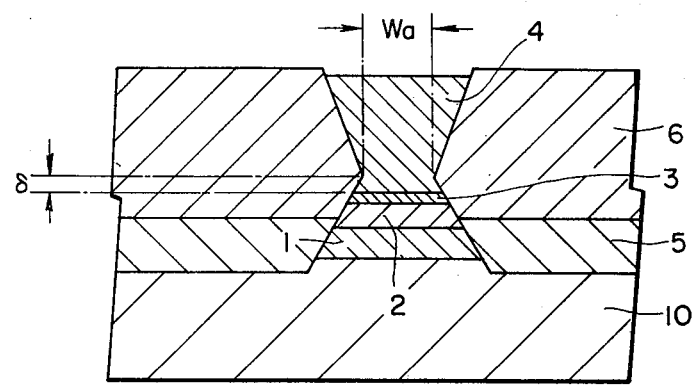
FIG. 4 is a sectional view of a Fabry-Perot resonator of a semiconductor device according to this invention as taken along a plane parallel to an optically flat face thereof.
Figure 5:
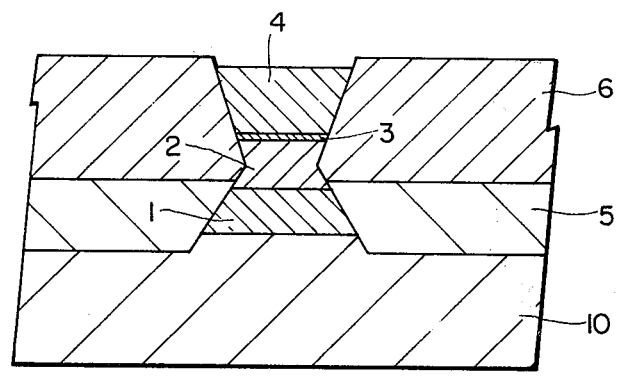
FIG. 5 is a sectional view of a semiconductor device as a comparative example.

FIG. 4 is a sectional view of the semiconductor laser of the present embodiment as taken along a plane parallel to optically flat faces constituting a Fabry-Perot resonator. FIG. 5 is a similar sectional view concerning an example in which the active layer lies above the position of the constriction of the mesa-shaped semiconductor layers. Numerals in the respective figures indicate the same parts as in the previous description.

The transverse mode of a semiconductor laser is closely related with the width ($W_a$) of the active layer and the position ($\delta$) of the active layer (as well as the optical guide layer) with respect to the constriction. The way of taking $W_a$ and $\delta$ is illustrated in FIG. 4. $\delta$ is denoted as plus in case where the active layer lies above the constriction, and as minus in case where it lies below the constriction.

Figure 6:
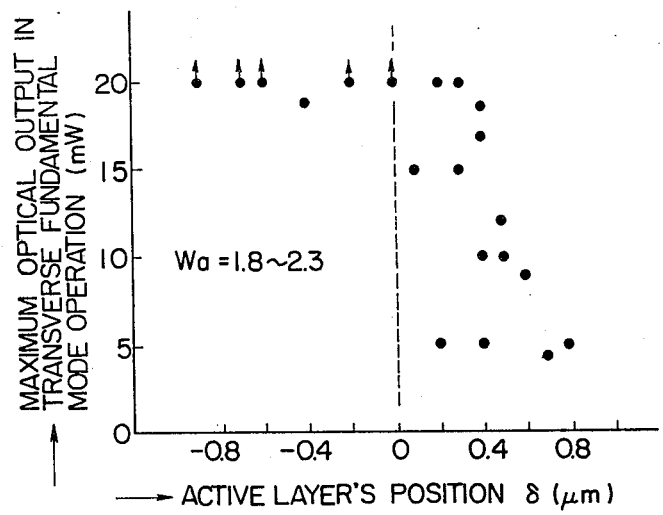
FIGS. 6 and 7 are graphs each showing the relationship between the position of an active layer and the maximum optical output in a transverse fundamental mode.
Figure 7:
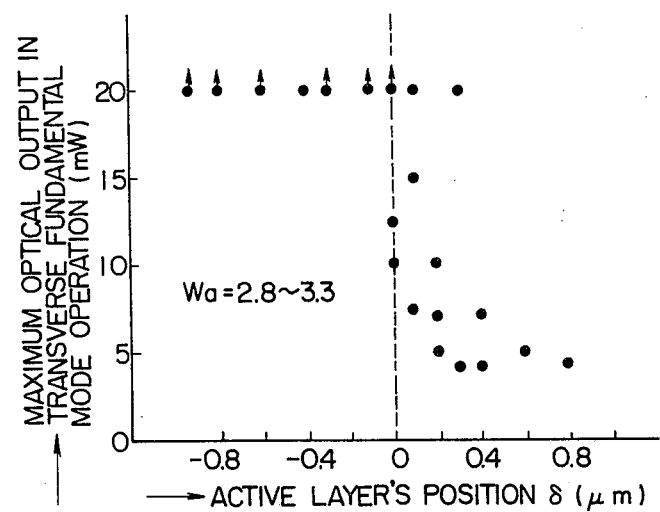

FIGS. 6 and 7 illustrate the relationships between the position ($\delta$; μm) of the active layer and how high the maximum optical output (mW) in the transverse fundamental mode can be. FIG. 6 shows the results of samples in which the stripe widths ($W_a$) were 1.8 μm—2.3 μm and comparatively small, while FIG. 7 shows the results of samples in which they were 2.8 μm–3.3 μm and comparatively great. The samples whose dots are assigned arrows exhibited at least the indicated values. It is understood from the results of both the graphs that, by locating the position of the active layer below the constriction, the maximum optical output in the transverse fundamental mode can be made much higher than in case of locating the position of the active layer above the constriction. The interpretation is possible that the range permitting a stable operation has been allowed to further expand the stripe width ($W_a$) to approximately 3.0 μm–3.3 μm.

Figure 8:
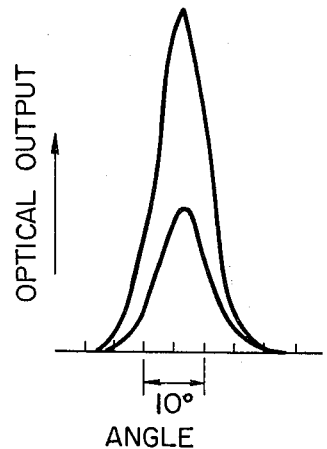
FIGS. 8 and 9 are graphs each showing far-field patterns in a semiconductor laser of this invention and a comparative example.
Figure 9:
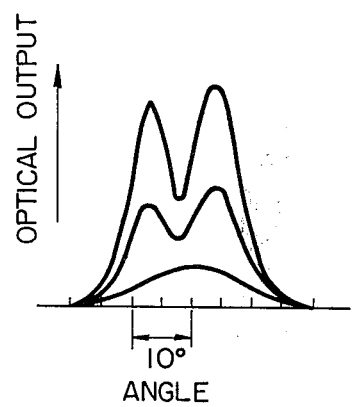

FIGS. 8 and 9 show examples of far-field patterns in the case where the position of the active layer lies below the constriction, i.e., where the structure of FIG. 4 is employed, and the case where the position of the active layer lies above the constriction, i.e., where the structure of FIG. 5 is employed, respectively. The axes of abscissas indicate the horizontal direction. The example of FIG. 8 can hold the transverse fundamental mode even when the optical output is increased, whereas the example of FIG. 9 falls into multi-mode oscillations due to the increase of the optical output.

Although, in the foregoing examples, the semiconductor material assembly for the optical confinement is formed on the n-type semiconductor substrate, it is also possible to form a semiconductor material assembly on a p-type semiconductor substrate. In this case, an optical guide layer is advantageously inserted between an n-type cladding layer and an active layer. The reason therefor is that positive holes are blocked at the interface between the active layer and the n-type cladding layer, while electrons are blocked at the interface of a p-type cladding layer, and that the p-type cladding layer side is susceptible to thermal influences on the leakage current. The optical guide layer is interposed between the active layer and the n-type cladding layer, and on the p-side, the p-type cladding layer is utilized to secure a great band gap difference from the active layer. In case of adopting such structure, it is similarly important that the narrowest part of the mesa of the foregoing mesa-shaped semiconductor material assembly is located on the side opposite to the optical guide layer with reference to the position of the active layer. In this example, the active layer and the overlying optical guide layer come to lie above the narrowest part of the mesa.

Although, in the above description, the semiconductor laser devices of the GaAs-GaAlAs system have been referred to, this invention is not specifically restricted to materials as apparent from the explanation of the principle.

Needless to say, this invention is extensively applicable to an InP-InGaAsP system, InGaP-GaAlAs system, GaAlSb-GaAlSbAs system etc. besides the GaAs-GaAlAs system.

What is claimed is:

1. In a semiconductor laser device wherein at least first, second, third and fourth semiconductor layers are stacked on a predetermined semiconductor body; the second semiconductor layer is an optical guide low in refractive index relative to the third semiconductor layer; the first and fourth semiconductor layers are low in refractive indices relative to both the second and third semiconductor layers, and have conductivity types opposite to each other; the fourth and second semiconductor layers are great in band gaps relative to the third semiconductor layer; side surfaces of the first, second, third and fourth semiconductor layers parallel to a traveling direction of laser radiation are buried by a fifth semiconductor layer; a refractive index of the fifth semiconductor layer is at least lower than that of the third semiconductor layer; and a band gap of the fifth semiconductor layer is at least greater than that of the third semiconductor layer, the improvement comprising the layers being formed in a mesa-shaped semiconductor material assembly, constructed of at least said first, second, third and fourth semiconductor layers, said assembly having a varying width in the direction of the stacked layers thereof, the narrowest part of the mesa lying on the side of said third semiconductor layer opposite the side of said second semiconductor layer.

2. A semiconductor laser device according to claim 1, wherein said fifth semiconductor layer consists of a plurality of layers, in which at least one P-N junction is included, and said P-N junction is reverse-biased at an operation of said semiconductor laser device.

3. A semiconductor laser device according to claim 1, wherein said fifth semiconductor layer is made of a high-resistivity semiconductor layer.

4. A semiconductor laser device according to claim 1, wherein said semiconductor body and said first and second semiconductor layers have an n-conductivity type, and said fourth semiconductor layer has a p-conductivity type.

5. A semiconductor laser device according to claim 4 wherein said semiconductor body is made of GaAs said first semiconductor layer is $Ga_{1-x}Al_xAs$ ($0.2 \leq x \leq 0.6$), said second layer is $Ga_{1-y}Al_yAs$ ($0.1 \leq y \leq 0.3$) and said fourth layer is $Ga_{1-v}Al_vAs$ ($0.2 \leq v \leq 0.4$).

6. A semiconductor laser device according to claim, wherein said first layer is doped with Sn, said second layer is doped with Sn and said third layer is doped with Ge.

7. A semiconductor laser device according to claim 6 wherein said first and second layers have a carrier concentration of about $5 \times 10^{17}$ cm$^{-3}$ and said fourth layer has a carrier concentration of $1 \times 10^{18}$ cm$^{-3}$.

8. A semiconductor laser device according to claim 1 wherein the distance between the narrowest part of the semiconductor material assembly and the position of the active layer is between 0.3 and 0.4 $\mu$m.

9. A semiconductor laser device according to claim 8 wherein the width of the narrowest portion is approximately between 1.8 and 3.3 $\mu$m.

10. A semiconductor laser device according to claim 1 wherein mesa-shaped semiconductor material assembly has an hour glass shape.

* * * * *